(12) United States Patent
Goyal et al.

(10) Patent No.: US 12,212,179 B2
(45) Date of Patent: Jan. 28, 2025

(54) DROP PROTECTION FOR A BATTERY

(71) Applicant: Hilti Aktiengesellschaft, Schaan (LI)

(72) Inventors: Varnim Goyal, Kaufering (DE); Bernd Ziegler, Schwabmuenchen (DE)

(73) Assignee: Hilti Aktiengesellschaft, Schaan (LI)

( * ) Notice: Subject to any disclaimer, the term of this patent is extended or adjusted under 35 U.S.C. 154(b) by 539 days.

(21) Appl. No.: 17/618,670

(22) PCT Filed: Jun. 16, 2020

(86) PCT No.: PCT/EP2020/066613
§ 371 (c)(1),
(2) Date: Dec. 13, 2021

(87) PCT Pub. No.: WO2020/260069
PCT Pub. Date: Dec. 30, 2020

(65) Prior Publication Data
US 2022/0239139 A1    Jul. 28, 2022

(30) Foreign Application Priority Data
Jun. 25, 2019    (EP) ..................................... 19182259

(51) Int. Cl.
| | |
|---|---|
| *H01M 10/44* | (2006.01) |
| *B25F 5/00* | (2006.01) |
| *G01F 15/18* | (2006.01) |
| *G01R 31/3835* | (2019.01) |
| *H01M 10/46* | (2006.01) |
| *H02J 7/00* | (2006.01) |

(52) U.S. Cl.
CPC .......... *H02J 7/007188* (2020.01); *B25F 5/00* (2013.01); *G01F 15/18* (2013.01); *G01R 31/3835* (2019.01)

(58) Field of Classification Search
CPC .............. H02J 7/007188; H02J 7/0042; G01R 31/3835; B25F 5/00; G01P 15/18
USPC .................. 320/107, 112, 114, 115, 127, 135
See application file for complete search history.

(56) References Cited

U.S. PATENT DOCUMENTS

| | | |
|---|---|---|
| 2007/0244471 A1 | 10/2007 | Malackowski et al. |
| 2008/0084180 A1 | 4/2008 | Hasegawa et al. |
| 2008/0174444 A1 | 7/2008 | Noda et al. |

(Continued)

FOREIGN PATENT DOCUMENTS

| | | |
|---|---|---|
| CN | 101078661 A | 11/2007 |
| CN | 101231302 A | 7/2008 |

(Continued)

OTHER PUBLICATIONS

International Search Report of PCT/EP2020/066613, dated Sep. 18, 2020.

(Continued)

*Primary Examiner* — Edward Tso
(74) *Attorney, Agent, or Firm* — Davidson Kappel LLC

(57) ABSTRACT

A method for controlling a system including at least one battery having at least one energy storage cell and a power-tool, wherein the system includes at least one acceleration sensor for detecting at least one acceleration value in an X, Y or Z direction, a device for measuring a voltage and a device for discharging the at least one energy storage cell. A system including at least one battery having at least one energy storage cell and a power-tool.

13 Claims, 4 Drawing Sheets

(56) References Cited

U.S. PATENT DOCUMENTS

| | | |
|---|---|---|
| 2010/0121226 A1 | 5/2010 | Ten Kate et al. |
| 2010/0176766 A1 | 7/2010 | Brandner et al. |
| 2012/0154979 A1 | 6/2012 | Signorelli et al. |
| 2012/0242144 A1 | 9/2012 | Chorian et al. |
| 2012/0279742 A1 | 11/2012 | Roser et al. |
| 2013/0307480 A1 | 11/2013 | Boggs et al. |
| 2014/0009113 A1 | 1/2014 | Robins et al. |
| 2014/0062410 A1 | 3/2014 | Schaefer et al. |
| 2014/0379188 A1 | 12/2014 | Uesaka et al. |
| 2015/0109129 A1 | 4/2015 | Merril et al. |
| 2017/0008417 A1 | 1/2017 | Yoshida et al. |
| 2017/0074899 A1 | 3/2017 | Jnichi et al. |
| 2017/0096127 A1 | 4/2017 | Zhang et al. |
| 2017/0276572 A1 | 9/2017 | Chen et al. |
| 2018/0026312 A1 | 1/2018 | Hinterberger et al. |
| 2018/0041062 A1 | 2/2018 | Ziegler et al. |
| 2018/0054502 A1 | 2/2018 | Wilson et al. |
| 2018/0183120 A1 | 6/2018 | Chan et al. |
| 2018/0331335 A1* | 11/2018 | Klee .................. H01M 10/655 |
| 2019/0198940 A1 | 6/2019 | Komiyama et al. |
| 2020/0044209 A1 | 2/2020 | Huggins et al. |
| 2020/0153225 A1 | 5/2020 | Kralik et al. |
| 2020/0303937 A1 | 9/2020 | Melman et al. |
| 2020/0313453 A1 | 10/2020 | Huggins et al. |
| 2021/0123737 A1 | 4/2021 | Vetter et al. |
| 2022/0084388 A1 | 3/2022 | Schmidt et al. |
| 2022/0239139 A1 | 7/2022 | Goyal et al. |

FOREIGN PATENT DOCUMENTS

| | | |
|---|---|---|
| CN | 101777673 A | 7/2010 |
| CN | 202869717 U | 4/2013 |
| CN | 103538018 A | 1/2014 |
| CN | 103987564 A | 8/2014 |
| CN | 106527343 A | 3/2017 |
| CN | 106232446 A | 4/2017 |
| CN | 107112783 A | 8/2017 |
| CN | 108701876 A | 10/2018 |
| DE | 102012017190 A1 | 3/2014 |
| DE | 102013201345 A1 | 7/2014 |
| EP | 0345655 A2 | 12/1989 |
| EP | 3200313 A1 | 8/2017 |
| EP | 3223202 A1 | 9/2017 |
| JP | 2010038839 A * | 2/2010 |
| WO | WO2013104700 A1 | 7/2013 |
| WO | WO2020/260068 A1 | 12/2020 |
| WO | WO2020/260079 A1 | 12/2020 |
| WO | WO2020260069 A1 | 12/2020 |

OTHER PUBLICATIONS

International Search Report of PCT/EP2020/066681, dated Sep. 18, 2020.

International Search Report of PCT/EP2020/066606, dated Aug. 25, 2020.

* cited by examiner

DROP PROTECTION FOR A BATTERY

SUMMARY OF THE INVENTION

The present invention relates to a method for controlling a system comprising at least one battery having at least one energy storage cell and a power-tool, wherein the system comprises at least one acceleration sensor for detecting at least one acceleration value in an X, Y or Z direction, a device for measuring a voltage and a device for discharging the at least one energy storage cell.

The present invention also relates to a system comprising a power-tool and at least one battery having at least one energy storage cell.

In particular, the present invention relates to a system comprising a handheld power tool combinable with a battery having at least one rechargeable battery cell. The handheld power tool can be in shape of a cordless screwdriver, circular saw, jigsaw, reciprocating saw, cordless drill or the like.

On a building site when operating a system comprising a power tool powered by a battery it is not unusual to unintentionally dropping the system from a certain height onto the ground. Additionally, it is not uncommon to intentionally throwing the system a certain distance also resulting in dropping onto the ground.

Modern power tools as well as batteries are very robust and can withstand a relative high amount of misuse and rough handling. Dropping and falling even relative high distances to a hard and inelastic ground do not harm the power tool and/or battery.

However, it is still possible that the system comprising the power tool and battery is getting damaged after being dropped from a certain height. In the case of a damaged power tool and/or battery continuing operating the system could be potentially dangerous for a user.

It is an object of the present invention to provide a method for controlling a system comprising at least one battery having at least one energy storage cell and a power-tool as well as a system comprising at least one battery having at least one energy storage cell and a power-tool, in order to increase the safety for a user of the system after a drop form a certain, i.e. critical height.

According to the present invention, there is provided a method for controlling a system comprising at least one battery having at least one energy storage cell and a power-tool, wherein the system comprises at least one acceleration sensor for detecting at least one acceleration value in an X, Y or Z direction, a device for measuring a voltage and a device for discharging the at least one energy storage cell.

Additionally, the method comprises the steps of

Determining that the system is free-falling by detecting an acceleration value in the X, Y and Z direction being equal to predetermined range;

Determining an impact of the system by detecting at least one acceleration value in the X, Y or Z direction exceeding a first predetermined threshold value;

Determine a traveling distance between detecting an acceleration value in the X, Y or Z direction being equal to predetermined range and detecting at least one acceleration value in the X, Y or Z direction exceeding the first predetermined threshold value;

Determining an orientation of the system at the impact by evaluating the at least one acceleration value in the X, Y or Z direction by means of a look-up table;

Determining a point of impact on a housing of the system by interpreting the orientation of the system at the impact in reference to the dimensions of the housing and determining a horizontal distance to a center of gravity of the system;

Detecting a first and second voltage value of the at least one energy storage cell by means of the device for measuring a voltage; and Discharging the at least one energy storage cell by means of the device for discharging if the traveling distance exceeds a predetermined threshold value, the at least one acceleration value in the X, Y or Z direction exceeds a second predetermined threshold value, the horizontal distance is less than a predetermined threshold value, the acceleration values in the X, Y or Z direction equal predetermined values or the difference value between the first and second detected voltage value of the at least one energy storage cell is less than a predetermined threshold value.

When the system is free falling, the predetermined range of the detected acceleration value in the X, Y or Z direction lies between −0.1 g and +0.1 g. In other words: the reading of the acceleration value in the X, Y or Z direction is around zero.

In a further preferred embodiment, the method can comprise the step of detecting the first voltage value of the at least one energy storage cell after a first predetermined period of time.

It is also advantageous that the method comprises the step of detecting a second voltage value of the at least one energy storage cell after expiration of the first or a second predetermined period of time.

According to the present invention, there is also provided a system comprising at least one battery having at least one energy storage cell and a power-tool.

Additionally, the system comprises at least one acceleration sensor for detecting at least one acceleration value in an X, Y or Z direction, device for measuring a voltage and a device for discharging the at least one energy storage cell.

The inventive system is able to execute the inventive method and thereby provides at least the same advantages as the inventive method.

BRIEF DESCRIPTION OF THE DRAWINGS

Further advantages and preferred embodiments will be described in the following together with the drawings listed below. The expressions "left", "right", "below" and "above" used in the following description, are referred to the drawings in an alignment such that the reference numbers and the notation of the Figs. used can be read in normal.

In the drawings.

DETAILED DESCRIPTION

Example

Figure 1:
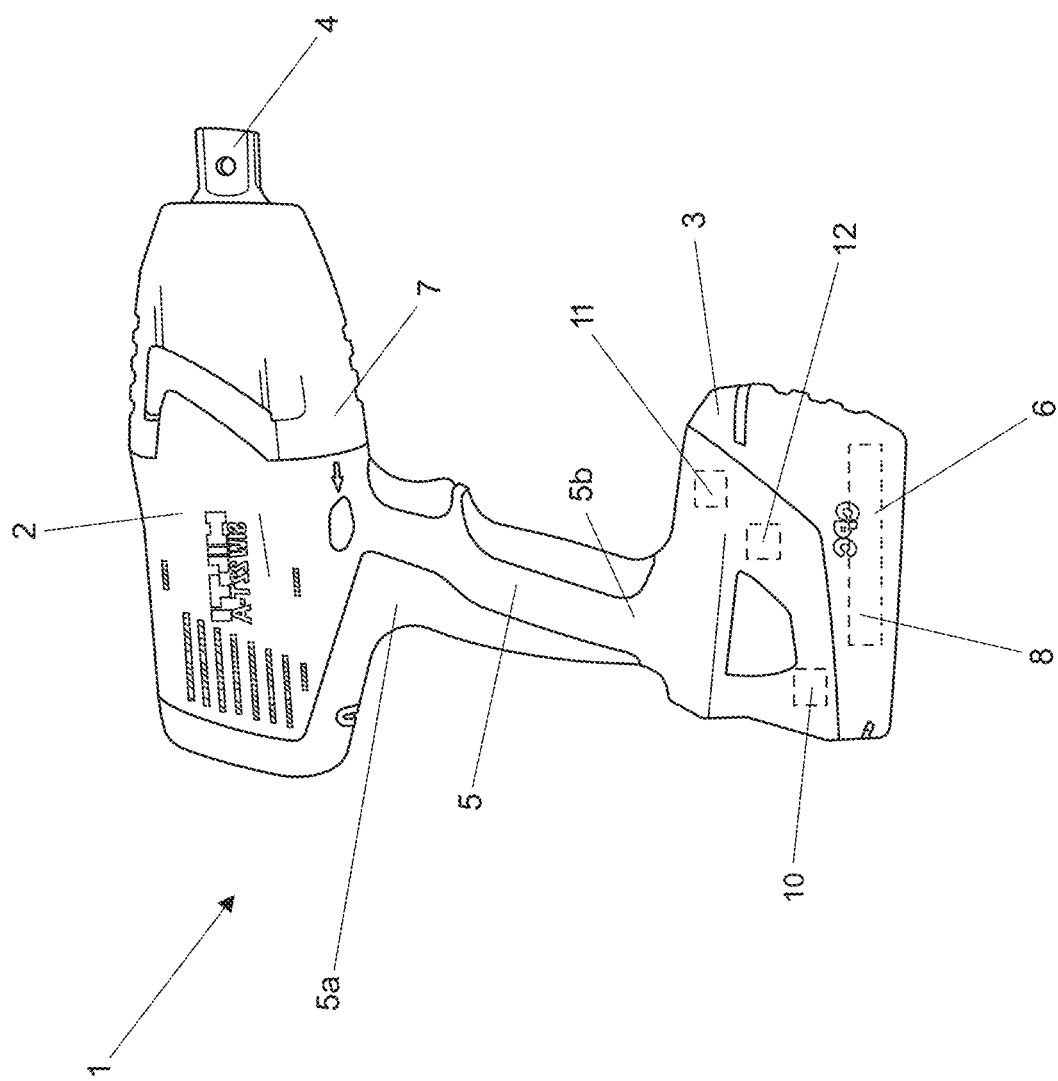
FIG. 1 a side-view of a hand-held power tool with a battery, a piezoelectric sensor, device for measuring voltage, an acceleration sensor, a temperature sensor as well as a signal transmitter.
Figure 2:
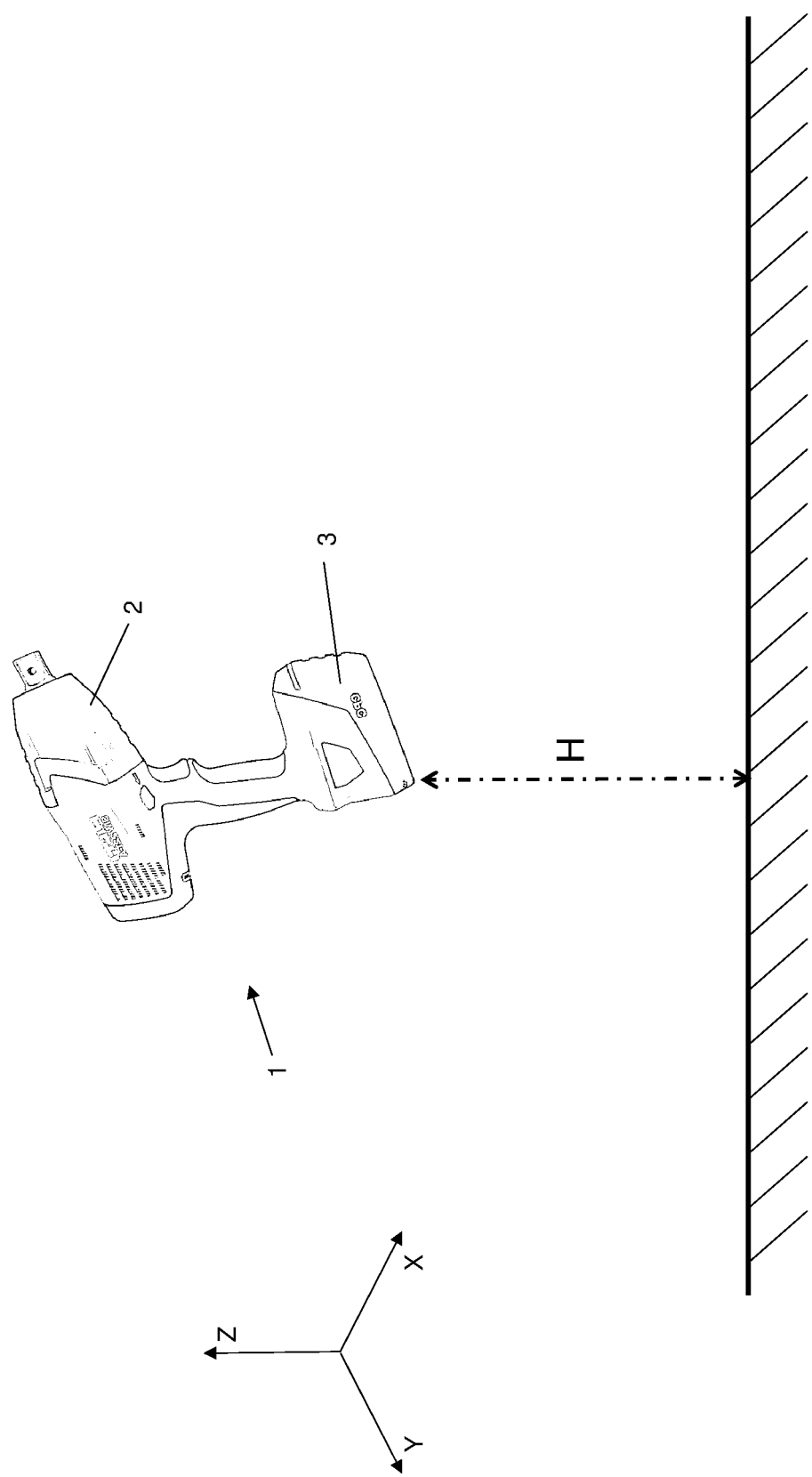
FIG. 2 the hand-held power tool at a certain height above a solid ground.
Figure 3:
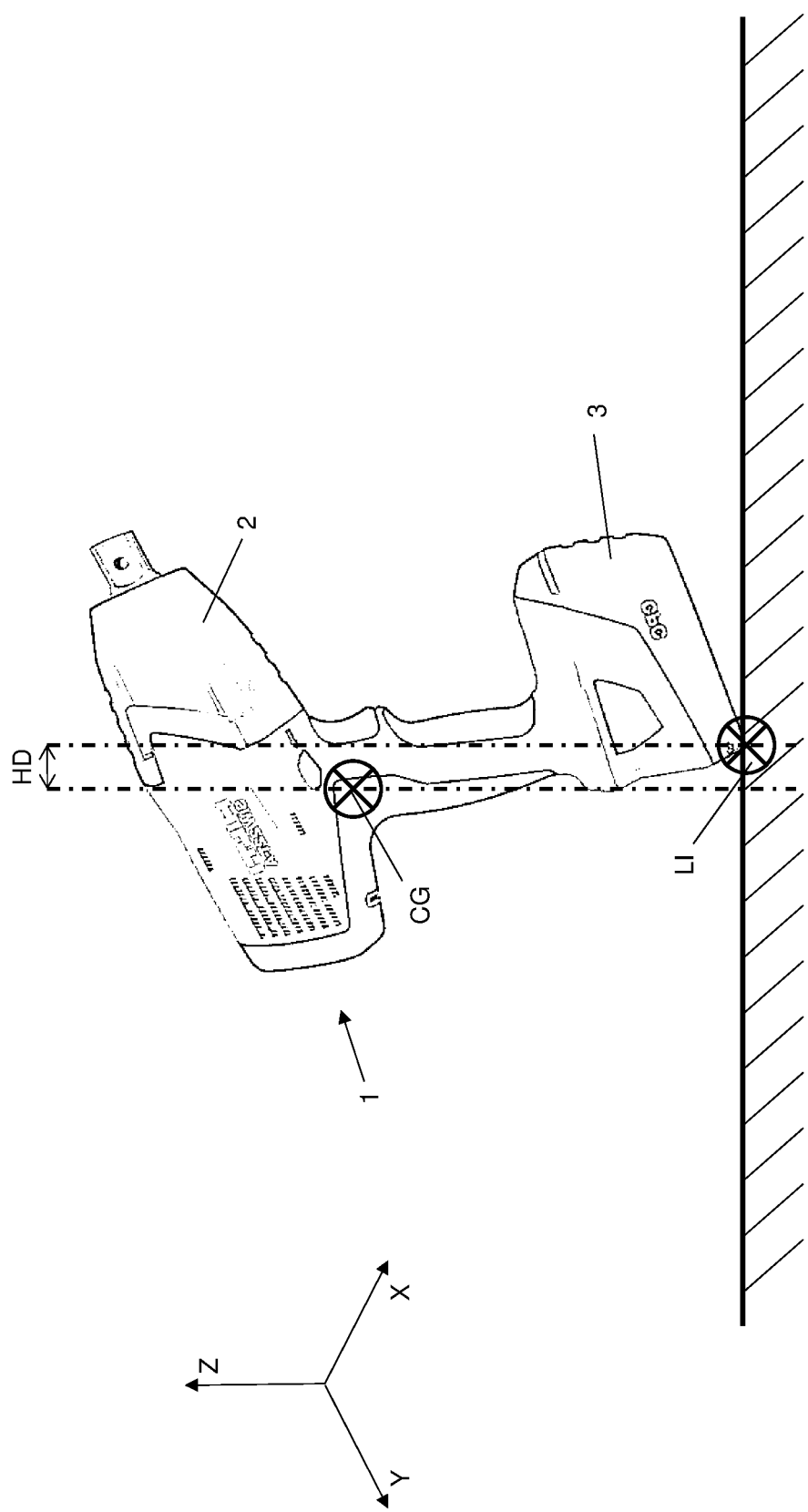
FIG. 3 the hand-held power tool at the moment of impact onto a solid ground.

FIG. 1 shows a system 1 comprising a handheld power tool 2 as well as a battery 3. The battery 3 is removable attached to the power tool 2, in order to supply electrical energy to the power tool 2. Within the example shown, the power tool 2 is in form of a cordless screw driver. It is however possible that the power tool is in form of a cordless saw, grinder, drill or the like.

The handheld power tool 2 embodied as a cordless screw driver comprises essentially a housing 7, an electric motor, a gear box, a tool holding device 4 and a handle 5. The handle comprises an upper end 5a and lower end 5b, whereby the battery 3 is removable attached to the lower end 5b of the handle 5.

A drive shaft of the electric motor is connected via the gear box to the tool holding device 4, in order to eventually transfer a torque produced by the electric motor to a tool (e.g. a bit) held by the tool holding device 4. The electric motor, the drive shaft as well as the gear box are not illustrated in the figures.

The battery 3 comprises a housing 6, in which several energy storage cells 8 for storing and releasing electrical energy are positioned. The energy storage cells 8 can also be termed battery cells or cells. In addition to that, the battery 3 also comprises a controlling device 9 for controlling and regulating all processes within the battery 3. The controlling device 9 can also be termed central processing unit (CPU), battery management system, battery management device, central processor or main processor. Also, the controlling device comprises a memory (i.e. storage element) and a clock (or stop watch) for measuring and recording time, time periods and time intervals.

In addition to that an acceleration sensor 10 is positioned within a housing 6 of the battery 3. The acceleration sensor 10 can be in form of an accelerometer. It is, however, also possible that an additional accelerometer or a single accelerometer is positioned within a housing 7 of the power tool 2. FIG. 1 illustrates a system 1 with an accelerometer 10 within the housing 6 of the battery 3.

The acceleration sensor or accelerometer 10 serves to record and measure accelerations, i.e. acceleration values, effecting the system 1 and, in particular, the battery 3. The accelerometer 10 used within the inventive system is formed to record and measure G-forces (i.e. gravitational forces: 1 g equals to 9.81 m/s$^2$) and in particular the gravitational forces and the ground reaction forces. The accelerometer 10 is configured to record and measure acceleration values in a X-Y and Z-direction of the system 1. The X-Y and Z-direction can also be understood as X-Y and Z-axes. Beyond that, the accelerometer 10 is connected to the controlling device, in order to transfer and receive signals and data.

Furthermore, the system 1 also comprises a device for measuring a voltage 11 of the energy storage cells 8. The device for measuring a voltage 11 is positioned within the housing 6 of the battery 3. The device for measuring a voltage 11 can also be termed voltmeter. According to an alternative embodiment of the present invention, the device for measuring a voltage 11 or an additional device for measuring a voltage can be positioned within the housing 7 of the power tool 2. In one example, the device for measuring a voltage 11 can be in form of a voltmeter. The device for measuring a voltage 11 is configurated to measure the voltage of the energy storage cells 8 in regular or irregular time intervals.

Beyond that, the device for measuring a voltage 11 is connected to the controlling device 9, in order to transfer and receive signals and data.

Additionally, the system 1 also comprises a device for discharging the energy storage cell 12, which serves to discharge or drain an electrical charge from each energy storage cell 8. The device for discharging the energy storage cell 12 can also be termed discharging device and can be in form of one or more resistors or capacitors. According to a preferred embodiment of the present invention the device for discharging the energy storage cell 12 is located within the housing 6 of the battery 3. In an alternative embodiment of the present invention it is also possible that a single or additional device for discharging the energy storage cell 12 is located within the housing 7 of the power tool 2.

Beyond that, the device for discharging the energy storage cell 12 is connected to the controlling device 9, in order to transfer and receive signals and data.

In the case the system 1 is dropped from a certain height H to the ground, the accelerometer 10 will measure a value of about zero in X-Y and Z-direction, as the system 1 will be in free fall. Due to measuring uncertainty or measuring errors the measured value of the accelerometer 10 would be in the range of −0.01 g and +0.01 g. Any reading within this range would identify the system as free falling.

When the system 1 eventually reaches the ground, i.e. moment of impact on the ground, the accelerometer 10 measures a relative high acceleration value in at least one of the X-Y or Z-direction.

The time from the start of the free fall of the system 1, i.e. nearly zero measurement of the accelerometer 10, to the moment of impact is recorded by the clock within the controlling device 9. By measuring the time for the system 1 to travel, i.e. fall or drop, to the ground the distance, i.e. drop height, can be calculated by means of the equation:

$$\text{distance} = 0.5 \times (\text{acceleration value}) \times (\text{time}^2).$$

If the distance (i.e. drop height) is greater than 2 m (i.e. meter), the drop on a hard, non-elastic ground can, in general, be considered critical for the system 1. A predetermined threshold value for the distance (i.e. drop height) is 2 m.

As the accelerometer 10 is configured to measure acceleration values (i.e. G-force values) in all three X-Y and Z-direction of the system 1, the orientation of the system at the moment of impact can be determined.

Figure 4:
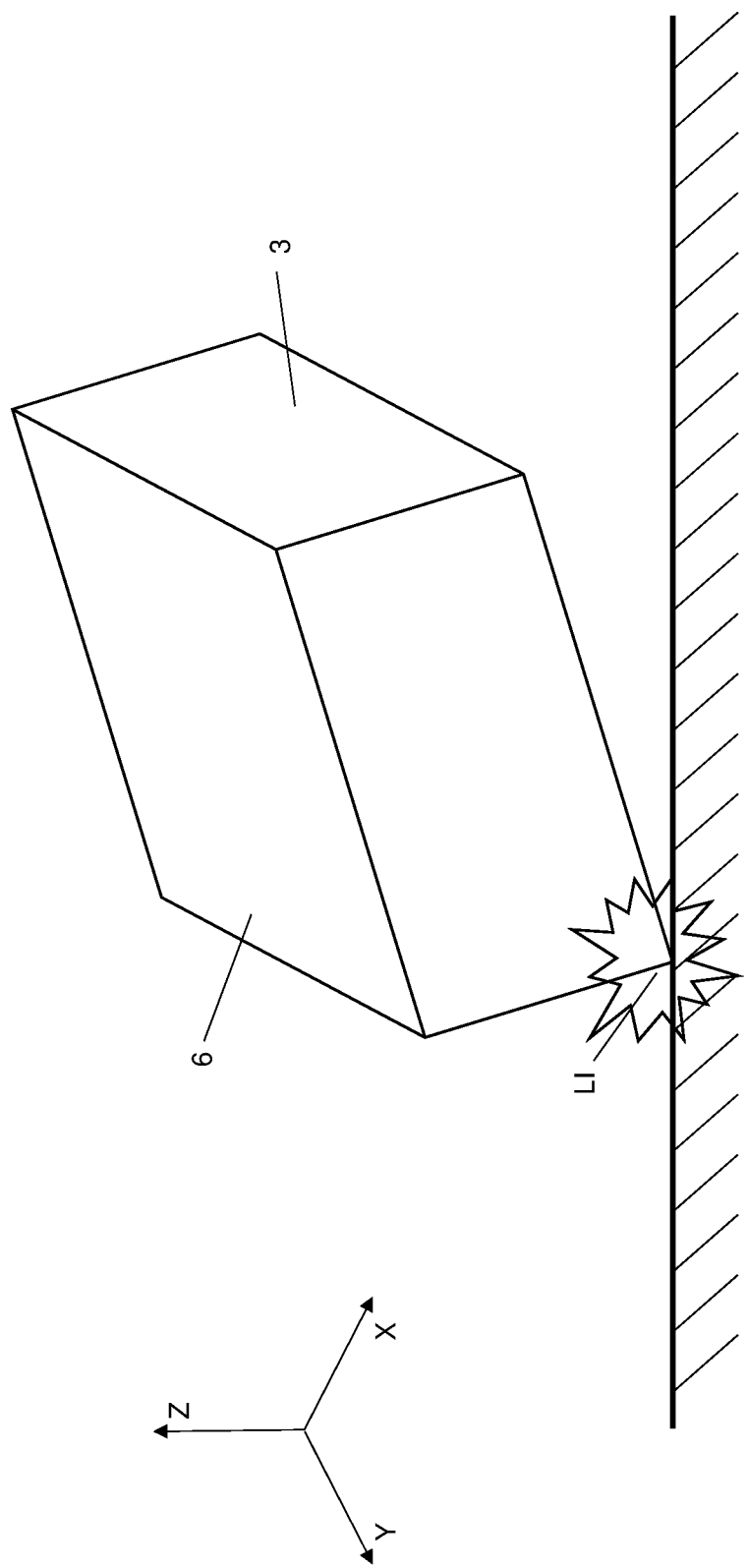
FIG. 4 the battery in a certain orientation at the moment of impact onto a solid ground.

By means of the look-up table as well as the magnitude and plus- or minus-sign of the individual acceleration values the actual point of impact of the system 1 can be determined. So, for example, means a high magnitude and negative reading (i.e. minus sign) of the acceleration value (i.e. G-force) in the X-direction that the left-hand-side of the housing 6 of the battery 3 is contacting the ground at the moment of impact. A high magnitude and positive reading (i.e. plus sign) of the acceleration value (i.e. G-force) in the Y-direction means that the back-side side of the housing 6 of the battery 3 is contacting the ground at the moment of impact. And, a high magnitude and positive reading (i.e. plus sign) of the acceleration value (i.e. G-force) in the Z-direction means that the bottom of the housing 6 of the battery 3 is contacting the ground at the moment of impact. FIG. 4 shows a case, in which the battery is impacting into the ground after a fall. With the help of the individual acceleration values in the X-Y and Z-direction it can be determined that the battery 3 is orientated (i.e. tilted) to the left-hand side, bottom and back-side of the housing 6 of the battery 3 at the moment of impact. By determining the orientation of the housing 6 of the battery 3 the orientation of the entire system 1 can also be determined. Determining the orientation of the entire system 1 at the moment of impact can be calculated by regarding the exterior dimension of the housing 7 of the power tool 2 and the housing 6 of the battery 3.

In this context, a high magnitude of an acceleration value means at least 50% of a maximum detectable acceleration value.

The location of the center of gravity CG of the system 1 is stored in and can be provided by the controlling device 9. By connecting a power tool 2 with a battery 3 certain data and information are exchanged via an interface (i.e. connecting device) between the power tool 2 and battery 3. The location of the center of gravity CG is an example of the data and information.

By determining the orientation of the system 1 at the moment of impact and considering the location of the center of gravity CG of the system 1 a horizontal distance HD can be determined (i.e. calculated) between the actual location of impact LI and the center of gravity CG. The shorter the horizontal distance HD between the actual location of impact LI and the center of gravity CG, the closer the center of gravity CG is above the location of impact LI of the housing 6 of the battery 3. A predetermined threshold value for the horizontal distance HD is about 50 mm. If a determined horizontal distance HD is less than the threshold value of 50 mm, the drop happened to the system 1 is considered critical. If the center of gravity CG is, for example, directly, i.e. in a vertical line, above the location of impact LI, most of the weight of the system 1 is falling and thereby acting on the location of impact LI. The more weight is acting on the location of impact LI, the larger the damages that could be caused to the system 1. The information about the location of the center of gravity CG of the system 1 is can be determined by means of look-up tables. When connecting the battery 3 with the power tool 2 information and data are being transferred via an interface between the battery 3 and the power tool 2. The information and data serve to identify the type of battery 3 and the type of power tool 2. They also serve to check compatibility between the two components, i.e. power tool 2 and battery 3. The identification data of the battery 3 and power tool 2 is transmitted to the memory of the controlling device 9. By means of a pre-stored look-up table the center of gravity CG of the specific combination of battery 3 and power tool 2 (i.e. system 1) is available. The actual location of the center of gravity CG is represented by coordination data in reference to the housing 7 of the system 1. The housing 7 of the system 1 comprises the housing 6 of the battery 3 as well as the housing 7 of the power tool 2. The housing can also be termed case or casing.

The device for measuring a voltage 11 is positioned within the housing 6 of the battery 3 and is measuring the voltage of each of the battery cells 8. The device for measuring a voltage 11 is connected to the controlling device 9 and the measurement of the voltage is transferred to the controlling device 9. The device for measuring a voltage 11 is measuring a first and second voltage value. If a difference value between the first and second voltage value is greater than a predetermined threshold value, it can be assumed that the battery 3 is not functioning normally and is potentially damaged. The difference between the first and second detected voltage value could be about 0.1 Volt and should have occurred within 60 seconds. A predetermined threshold value for the difference value is 0.1 Volt and a predetermined threshold value for the time is 60 seconds. With other words: if a voltage difference of at least 0.1 Volt and within a maximum duration of 60 seconds occurs, a critical situation could have happened to the system 1.

After an impact, i.e. drop of the system 1, the detected data and information of the horizontal distance HD between the center of gravity CG and location of impact LI, the drop height H, the detected difference between a first and second voltage value of the battery 3, the actual acceleration values in the X-Y and Z-direction are transferred to the controlling device 9.

The device for discharging the battery 12 is discharging the battery 3 (i.e. the cells 8), if the traveling distance (=drop height H) exceeds a predetermined threshold value, the at least one acceleration value in the X, Y and Z direction exceeds a second predetermined threshold value (i.e. maximum value at impact); the horizontal distance HD is below a predetermined threshold value, the (three) acceleration values in the X, Y and Z direction equal predetermined values and the detected voltage value of the at least one energy storage cell 8 is less than a predetermined threshold value.

What is claimed is:

1. A method for controlling a system having at least one battery having at least one energy storage cell, a power tool connected to the battery, and at least one acceleration sensor connected to the battery for detecting at least one acceleration value in an X, Y or Z direction, a measurer connected to the battery or measuring a voltage and a discharge connected to the battery for discharging the at least one energy storage cell, the method comprising:
    determining a free-fall state of the system by detecting the at least one acceleration value in the X, Y and Z direction being equal to a predetermined range;
    determining an impact of the system by detecting the at least one acceleration value in the X, Y or Z direction exceeding a first predetermined threshold value;
    determining a travel distance between the detecting of the at least one acceleration value in the X, Y or Z direction being equal to the predetermined range and the detecting of the at least one acceleration value in the X, Y or Z direction exceeding the first predetermined threshold value;
    determining an orientation of the system at the impact by evaluating the at least one acceleration value in the X, Y or Z direction using a look-up table;
    determining a point of impact on a housing of the system by interpreting the orientation of the system at the impact in reference to the dimensions of the housing and determining a horizontal distance to a center of gravity of the system;
    detecting a first and second voltage value of the at least one energy storage cell via the measurer for measuring the voltage; and
    discharging the at least one energy storage cell via the discharge for discharging if the traveling distance exceeds a predetermined threshold value, the at least one acceleration value in the X, Y or Z direction exceeds a second predetermined threshold value, the horizontal distance is less than a third predetermined threshold value, each of the at least one acceleration values in the X, Y or Z direction equal further predetermined values or a difference value between the first and second detected voltage value of the at least one energy storage cell is less than a fourth predetermined threshold value.

2. The method as recited in claim 1 wherein the detecting the first voltage value of the at least one energy storage cell occurs after a first predetermined period of time.

3. The method as recited in claim 1 wherein the detecting the second voltage value of the at least one energy storage cell occurs after expiration of the first or a second predetermined period of time.

4. The method as recited in claim 1 wherein the discharging of the at least one energy storage cell via the discharge for discharging occurs if the traveling distance exceeds the predetermined threshold value.

5. The method as recited in claim 1 wherein the discharging of the at least one energy storage cell via the discharge for discharging occurs if the at least one acceleration value in the X, Y or Z direction exceeds the second predetermined threshold value.

6. The method as recited in claim 1 wherein the discharging of the at least one energy storage cell via the discharge for discharging occurs if the horizontal distance is less than the third predetermined threshold value.

7. The method as recited in claim 1 wherein the discharging of the at least one energy storage cell via the discharge for discharging occurs if each of the at least one acceleration values in the X, Y or Z direction equal further predetermined values.

8. The method as recited in claim 1 wherein the discharging of the at least one energy storage cell via the discharge for discharging occurs if the difference value between the first and second detected voltage value of the at least one energy storage cell is less than the fourth predetermined threshold value.

9. A system comprising:
at least one battery having at least one energy storage cell;
a power tool connected to and powered by the battery;
at least one acceleration sensor connected to the battery for detecting at least one acceleration value in an X, Y or Z direction;
a measurer connected to the battery for measuring a voltage; and
a discharge connected to the battery for discharging the at least one energy storage cell.

10. The system as recited in claim 9 wherein the battery has a housing and the at least one acceleration sensor is located in the housing.

11. The system as recited in claim 9 wherein the battery has a housing and the measurer is located in the housing.

12. The system as recited in claim 9 wherein the battery has a housing and the discharge is located in the housing.

13. The system as recited in claim 9 wherein the battery has a housing and the at least one acceleration sensor, the measurer and the discharge are located in the housing.

* * * * *